United States Patent [19]

Cave

[11] 4,122,403
[45] Oct. 24, 1978

[54] TEMPERATURE STABILIZED COMMON EMITTER AMPLIFIER

[75] Inventor: David L. Cave, Tempe, Ariz.

[73] Assignee: Motorola, Inc., Schaumburg, Ill.

[21] Appl. No.: 806,035

[22] Filed: Jun. 13, 1977

[51] Int. Cl.² ............................................. H03F 1/32
[52] U.S. Cl. .................................. 330/289; 330/288; 330/296
[58] Field of Search ...................... 330/289, 296, 288

[56] References Cited

U.S. PATENT DOCUMENTS 3,546,614  12/1970  Lochstampfer ................. 330/296 X Primary Examiner—Lawrence J. Dahl
Attorney, Agent, or Firm—Joe E. Barbee

[57] ABSTRACT

A common emitter amplifier having a resistor in series with its emitter and a resistor in series with its collector is temperature stabilized by providing a current source in parallel with the resistor in series with the collector. The current source provides additional emitter current to the transistor to decrease the transistors internal AC emitter resistance. Cascoded transistors are also used to improve the performance of the amplifier.

7 Claims, 3 Drawing Figures

TEMPERATURE STABILIZED COMMON EMITTER AMPLIFIER

BACKGROUND OF THE INVENTION

This invention relates, in general, to amplifiers and more particularly to a temperature stabilized common emitter amplifier.

Typically a common emitter amplifier is temperature stabilized by adding a resistor in series with the emitter of the transistor. The gain of the amplifier can then be calculated by dividing the resistance of this emitter resistor into the resistance of the collector load resistor of the amplifier, provided that the emitter resistor is much greater than the internal emitter resistance of the transistor and the collector load resistor is much smaller than the internal collector resistance of the transistor. Of course the smaller the resistance of the resistor in series with the emitter, the larger the gain. If the resistor is made too small though then an undesired effect occurs. The internal emitter resistance of the transistor becomes a dominant factor in calculating gain, and as is well known, the internal emitter resistance is directly proportional to temperature. Therefore, it is desirable to keep the external resistor in series with the emitter large enough so that the internal emitter resistance does not assume an overbearing factor in controlling gain. The collector load resistor cannot arbitrarily be increased to increase the gain due to the low power supply voltage normally associated with integrated circuits. In addition, increasing the collector load resistance would change the quiescent operating current of the amplifier if voltage feedback is provided because the voltage feedback requires the quiescent output voltage to be the same for different values of collector load resistance. If the collector load resistance is increased for a given value of supply voltage, $V_{CC}$, and of feedback voltage, then of course, the emitter current will be lower and, as a result, the internal emitter resistance will increase. One scheme widely used in integrated circuits to increase the gain of a common emitter amplifier is to replace the collector load resistor with a current source. This works well for many applications, however, such a scheme is not satisfactory for applications requiring closely controlled gain of the common emitter amplifier since gain is not too closely controlled when the collector load resistor is replaced by a current source.

Accordingly, it is an object of the present invention to provide an improved common emitter amplifier.

Another object of the present invention is to provide a common emitter amplifier that has temperature stabilization and closely controlled gain.

Yet another object of the present invention is to provide a common emitter amplifier having a current source in parallel with the collector load resistor.

A further object is to provide a common emitter amplifier, having a collector load resistor, with additional emitter current to decrease the effects, of variations of the internal emitter resistance of the transistor with temperature, on gain of the amplifier.

SUMMARY OF THE INVENTION

In carrying out the above and other objects of the invention in one form, there is provided an improved common emitter amplifier that is temperature stabilized and has a closely controlled improved gain. A transistor is connected as a common emitter amplifier having a resistor in series with its emitter and a collector load resistor. A current source is added in parallel with the collector load resistor to supply additional current to the emitter of the transistor thereby reducing the internal resistance of the transistor's emitter.

In one exemplification, the current source is provided by two transistors cascoded to provide a high impedance in parallel with the collector load resistor. In addition the transistor amplifier can be cascoded to present a high output impedance, if desired.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner.

DESCRIPTION OF THE PREFERRED EMBODIMENTS

The gain of a common emitter amplifier can be approximated by the following equation:

$$A_V = R_X/(R_E + r_e)$$

where $A_V$ equals the voltage gain of the amplifier, $R_X$ equals the collector load resistance in parallel with the internal collector resistance of the transistor, $R_E$ is the resistance of an external resistor in series with the emitter of the transistor, and $r_e$ is the transistor's internal AC emitter resistance. The internal resistance of the transistor's collector is usually assumed to be so much larger than the collector's load resistor that $R_X$ is generally considered to be equal to the collector's load resistor. The internal resistance of the transistor's emitter can be represented by the following equation:

$$r_e = kT/q\, I_E$$

where $k$ equals Boltzmann's constant, T is temperature, $q$ is the charge of an electron, and $I_E$ is the emitter current of the transistor. From the equation for the gain it can be seen that if the resistor in series with the emitter is decreased substantially, in order to cause the gain to be larger, the internal resistance of the emitter can become the dominant factor. However, it will be noted that the internal resistance of the emitter is directly proportional to temperature and therefore will vary as temperature varies. Since temperature is not always easily controlled and Boltzmann's constant is a fixed value and the charge of an electron is fixed, the only parameter left is the emitter current. As can be seen from the above equation, as the emitter current is increased the internal emitter resistance decreases. If the internal emitter resistance becomes small enough it will then have a minimum effect on the gain of the amplifier.

Figure 1:
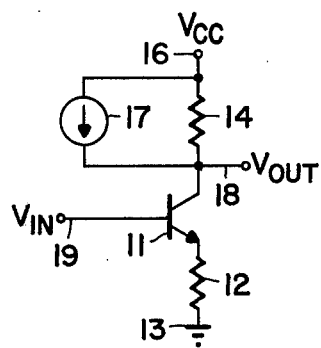
FIG. 1 illustrates a simplified version of the invention in one form.

Referring now to FIG. 1, a transistor 11 is connected as a common emitter amplifier. Resistor 12 is in series with the emitter of transistor 11 and couples the emitter to a common reference 13. Resistor 14 is a collector load resistor for transistor 11 and couples the collector to a potential appearing on line 16. The output of the amplifier appears on line 18 which is connected to the junction formed by the collector of transistor 11 and resistor 14. An input to the circuit appears on line 19 which is connected to the base of transistor 11. A current source 17 appears in parallel with resistor 14. The purpose of current source 17 is to pump additional current into transistor 11 in order to decrease the internal emitter resistance of transmitter 11. As noted hereinabove, the gain of a common emitter amplifier is less affected by temperature when the internal emitter resistance of the transistor is decreased. The gain of the amplifier can now be increased by reducing resistor 12 without sacrificing the temperature stability of the amplifier. Transistor 11 will not become saturated with the additional current supplied by current source 17 as long as the quiescent operating point of the transistor remains the same which, of course, can be done by voltage feedback or by input bias.

Figure 2:
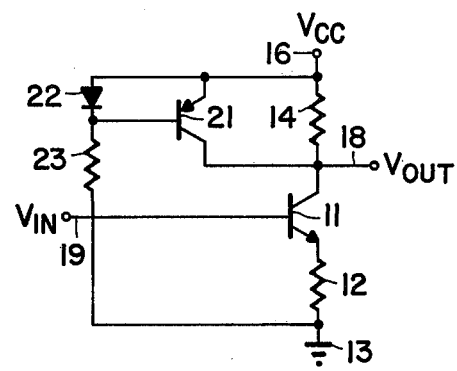
FIG. 2 is a more detailed representation of the circuit of FIG. 1.

In FIG. 2, the current source 17 of FIG. 1 has been replaced by a PNP transistor 21 and a bias source for transistor 21. The bias source includes diode 22 and resistor 23. Resistor 23 establishes a current flow through diode 22 while diode 22 provides a biasing voltage for transistor 21. Although the biasing for transistor 21 has been shown as being supplied by a diode and a resistor combination is should be noted that it could be supplied by any convenient source. The remainder of the circuit of FIG. 2 is the same as the circuit of FIG. 1. An input signal applied to line 19 will forward bias transistor 11 and will be amplified by transistor 11. The amplified input signal will appear on output line 18. The additional current supplied by transistor 21 will substantially all flow into the collector of transistor 11 as long as the impedance of the load connected to line 18 is much higher than the impedance afforded by the collector of transistor 11.

Figure 3:
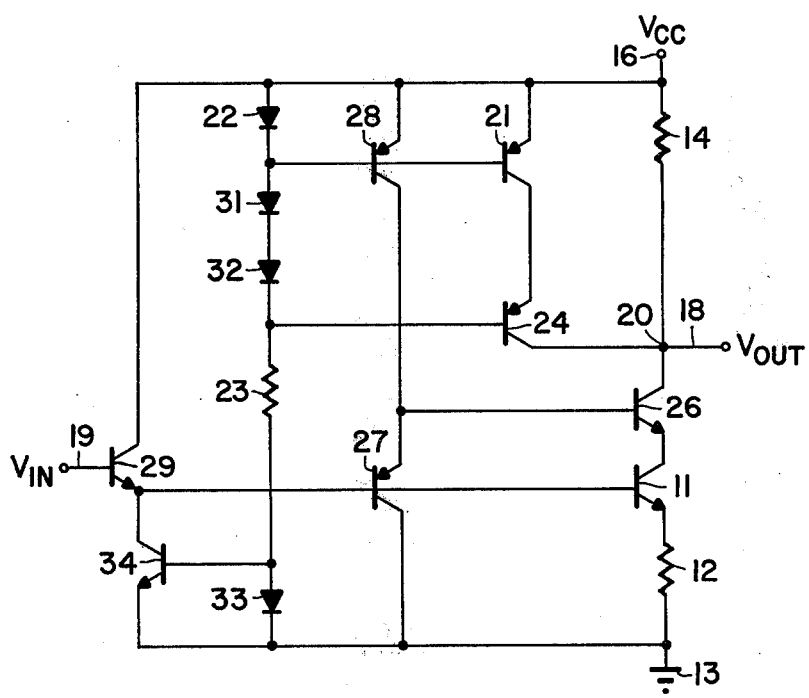
FIG. 3 illustrates the invention in another form thereof.

FIG. 3 illustrates an embodiment of the invention which is more suitable for being made in monolithic integrated circuit form. A transistor 26 has been cascoded with transistor 11 to provide a high output impedance for the amplifier thereby making the resistance of resistor 14 dominant at node 20. Also another PNP transistor has been cascoded with transistor 21 so that the impedance of the current source provided by transistor 21 and 24 will be high compared to the resistance of resistor 14. This is desirable so that the current source does not influence the gain of the amplifier. Two series diodes 31 and 32 have been added in series with diode 22 to provide bias for transistor 24. Two diode drops are provided between the bases of transistors 21 and 24 to ensure that the cascoded current source does not saturate. Bias for transistor 26 is provided by transistor 27 which is in series with transistor 28. The base of transistor 28 is tied to the same bias source as transistor 21. Transistor 28 serves as a current source for transistor 27. The base of transistor 27 is connected to the base of transistor 11 thereby providing one PN junction or one diode drop potential difference between the bases of transistor 11 and 26. This biases the cascode amplifier to prevent the amplifier from saturating. Transistor 29 has been added in series with input 19 to increase the input impedance. Although transistor 29 is not needed to improve the operation of the common emitter amplifier it may be required in applications requiring a high input impedance. This may be more so the case when the amplifier is used in a circuit having feedback connected to the input of the amplifier. If the input impedance is high then the feedback circuit will not be loaded down. The emitter of transistor 29 is connected to the bases of transistor 27 and transistor 11 and supplies the input signal to the base of transistor 11. Transistor 34 serves as a current source for transistor 29 and biases up the input transistor to prevent reverse current from flowing into the emitter of transistor 29. The bias for transistor 34 is provided by diode 33 connected in series with resistor 23. The collector of transistor 29 is connected to the power source appearing on line 16. In applications requiring a low input impedance at the output of the amplifier, transistors connected in a Darlington configuration can be connected to line 18 to provide the low output impedance.

The current supplied by the current source formed by transistors 21 and 24 is intended to increase the emitter current of transistor 11. However, if the load connected to line 18 is low enough in impedance it may be possible for some of the current from the current source to flow into the load. This problem can be overcome by use of the Darlington configuration discussed hereinabove. The circuit arrangement illustrated in FIG. 3 can be adjusted to operate at the same quiescent or Q point as the circuit of a simple, common emitter amplifier.

By now it should be appreciated that there has been provided temperature stabilization for a common emitter amplifier having a closely controlled gain. The gain of the circuit illustrated in FIG. 3 has been held between one and two percent variation over temperature. However, the gain can be held to under one percent variation by feeding additional current from the current source through the emitter of transistor 11. The circuit of FIG. 3 not only gives an increased gain but is very closely controlled and is very stable temperature wise.

Although the invention has been illustrated as having certain types of transistors, it will be understood that other types of transistors or semiconductor devices can be substituted to achieve the advantages of the present invention.

Consequently, while in accordance with the Patent Statutes, I have described what at present are considered to be the preferred forms of my invention it will be obvious to those skilled in the art that numerous changes and modifications may be made herein without departing from the true spirit and scope of the invention, and it is therefore aimed in the following claims to cover all such modifications.

What is claimed as new and desired to secure by Letters Patent of the United States is:

1. An amplifier having an input and an output for amplifying electrical signals, comprising: a first transistor having a base, emitter, and collector, the base being coupled to the input; a first resistor having a first and a second end, the first end being connected to the emitter of the first transistor, the second end being connected to a common reference; a second resistor having a first and a second end, the first end being connected to the collector of the first transistor, the second end of the second resistor being for connecting to a power source, the first end of the second resistor also being connected to the output; a second transistor for providing a current source in parallel with the second resistor, the second transistor having a base, emitter, and collector wherein the collector and emitter are connected to the first and second ends of the second resistor; a biasing source for providing bias to the base of the second transistor thereby providing an amplifier being temperature stabilized and having a closely controlled gain; and a third transistor in cascode with the second transistor and a fourth transistor in cascode with the first transistor.

2. The amplifier of claim 1 further including a fifth transistor having a base, emitter, and collector, the base being connected to the input, the emitter being coupled to the common reference, and the collector being for coupling to a power source, and wherein the base of the first transistor is coupled to the emitter of the fifth transistor.

3. An amplifier suitable for being made in monolithic integrated circuit form and having an input, an output and a power source connection comprising: a first transistor having a base, emitter and collector, the base being coupled to the input of the amplifier; a first resistance coupled between the emitter of the first transistor and a common reference; a second transistor having a base, emitter and collector, the emitter of the second transistor being coupled to the collector of the first transistor; a second resistance coupled between the collector of the second transistor and the power source connection, the collector of the second transistor also being coupled to the output; a first current source connected in parallel across the second resistance, the first current source providing additional collector-emitter current to the first and second transistors; and biasing means for biasing the base of the second transistor at a potential higher than the base of the first transistor, the biasing means being coupled to the bases of the first and second transistors.

4. The amplifier of claim 3 wherein the first current source includes two transistors connected in series so that substantially the same current flows in their collectors.

5. The amplifier of claim 3 further including a third transistor having a base, emitter and collector, the base being coupled to the input, the collector being coupled to the power source connection, the emitter being coupled to the base of the first transistor, and a second current source coupled between the emitter of the third transistor and the common reference.

6. The amplifier of claim 4 further including a second biasing means for providing biasing to the first current source.

7. A monolithic integrated circuit amplifier having an input and an output, comprising: a first and a second transistor each having a base, emitter and collector, the collector of the first transistor being coupled to the emitter of the second transistor, the collector of the second transistor being coupled to the output, a first resistance coupling the emitter of the first transistor to a common reference; a second resistance coupling the collector of the second transistor to a power source line; third and fourth transistors each having a base, emitter and collector, the collector of the third transistor coupled to the collector of the second transistor, the emitter of the third transistor coupled to the collector of the fourth transistor, the emitter of the fourth transistor coupled to the power source line; a fifth transistor having a base, emitter and collector, the base being coupled to the base of the first transistor, the collector being coupled to a common reference and the emitter being coupled to the base of the second transistor; a first current source coupled between the emitter of the fifth transistor and the power source line; a sixth transistor having a base, emitter and collector, the base being coupled to the input, the collector being coupled to the power source line, the emitter coupled to the bases of the fifth and first transistors; a second current source coupled between the emitter of the sixth transistor and the common reference; and at least one biasing means coupled to the bases of the third and fourth transistors, thereby providing a temperature stabilized amplifier.

* * * * *